United States Patent
Hand (10) Patent No.: US 12,422,503 B1
(45) Date of Patent: Sep. 23, 2025

(54) VEHICLE MAGNETOMETER CALIBRATION SYSTEM

(71) Applicant: MACH Industries Inc., Huntington Beach, CA (US)

(72) Inventor: Michael Lawrence Hand, Huntington Beach, CA (US)

(73) Assignee: MACH Industries Inc., Huntington Beach, CA (US)

( * ) Notice: Subject to any disclaimer, the term of this patent is extended or adjusted under 35 U.S.C. 154(b) by 0 days.

(21) Appl. No.: 19/231,983

(22) Filed: Jun. 9, 2025

(51) Int. Cl.
  *G01R 33/00* (2006.01)
  *G01R 35/00* (2006.01)

(52) U.S. Cl.
  CPC ....... *G01R 33/0017* (2013.01); *G01R 35/005* (2013.01)

(58) Field of Classification Search
  CPC ............ G01R 33/0017; G01R 33/0005; G01R 33/0011; G01R 33/00; G01R 1/00; G01R 1/02; G01R 1/04; G01R 1/0408; G01R 35/00; G01V 1/3835; G01V 2210/6163; G01V 2210/50; G01V 13/00
  See application file for complete search history.

(56) References Cited

U.S. PATENT DOCUMENTS

| | | | | |
|---|---|---|---|---|
| 2010/0121599 | A1* | 5/2010 | Boeve | G01C 17/38 702/93 |
| 2015/0354980 | A1* | 12/2015 | Wahdan | G01C 17/02 324/202 |
| 2016/0364990 | A1* | 12/2016 | Khaghani | G08G 5/57 |
| 2020/0200835 | A1* | 6/2020 | Vissiere | G01R 33/02 |
| 2020/0301040 | A1* | 9/2020 | Zhang | G01V 3/38 |

* cited by examiner

Primary Examiner — Alvaro E Fortich
(74) Attorney, Agent, or Firm — Fenwick & West LLP (57) ABSTRACT

A calibration system leverages a 3-axis Helmholtz coil device for generating a referential magnetic field for calibrating the magnetometer on-board a vehicle. The calibration system may include the magnetic field generator, a vehicle platform, and a computing device to determine the calibration parameters. The vehicle platform supports the vehicle with the magnetometer being calibrated. The magnetic field generator generates a referential magnetic field in three-dimensional space for calibration of the magnetometer. The computing device is configured to: receive magnetometer measurements from the magnetometer on-board the vehicle during generation of the referential magnetic field, and determine calibration parameters for calibrating the magnetometer based on the magnetometer measurements and the referential magnetic field generated by the magnetic field generator.

20 Claims, 8 Drawing Sheets

Vehicle Assembly Environment
100

VEHICLE MAGNETOMETER CALIBRATION SYSTEM

BACKGROUND

Vehicles may leverage sensors for sensing the vehicle's operating environment. A magnetometer is one sensor that can measure the magnetic field, including Earth's magnetic field, which can be useful for navigation. In some implementations, remote-controlled vehicles or autonomous vehicles may rely on accurate magnetometer readings to aid in navigation of the vehicles. However, the payload of a vehicle may include materials that interfere with the magnetic field surrounding the vehicle, causing distortions in the magnetometer measurements.

Traditional magnetometer calibration typically leverages a user to rotate an orientation of a device, using the Earth's magnetic field as a reference for the calibration. However, calibrating a magnetometer with this process requires the user to be able to physically rotate the device into a number of orientations. This can be infeasible with magnetometers integrated into human-sized vehicles. Moreover, some vehicles crafted to carry a payload are even heavier or larger in spatial dimensions, also adding to the infeasibility of human manipulation. These challenges make calibration of a vehicle's magnetometer particularly challenging, especially a magnetometer that is already integrated onto the vehicle.

SUMMARY

A calibration system leverages a 3-axis Helmholtz coil device for generating a referential magnetic field for calibrating the magnetometer on-board a vehicle. The calibration system may include the magnetic field generator, a vehicle platform, and a computing device to determine the calibration parameters. The vehicle platform supports the vehicle with the magnetometer being calibrated. The magnetic field generator generates a referential magnetic field in three-dimensional space for calibration of the magnetometer. The computing device is configured to: receive magnetometer measurements from the magnetometer on-board the vehicle during generation of the referential magnetic field, and determine calibration parameters for calibrating the magnetometer based on the magnetometer measurements and the referential magnetic field generated by the magnetic field generator. Using a magnetic field generator obviates the need to physically re-orient the vehicle and its magnetometer to perform magnetometer calibration.

With the vehicle stationary during the calibration procedure, the calibration system is equipped to calibrate the on-board magnetometer even after payload securement to the vehicle. Further, in some embodiments, the configuration of the vehicle may change during the course of its deployment. The calibration system can determine multiple sets of calibration parameters, specific to each configuration of the vehicle, empowering the vehicle's magnetometer to maintain calibration despite on-the-fly adjustments to its configuration.

DETAILED DESCRIPTION

System Environment

Figure 1:
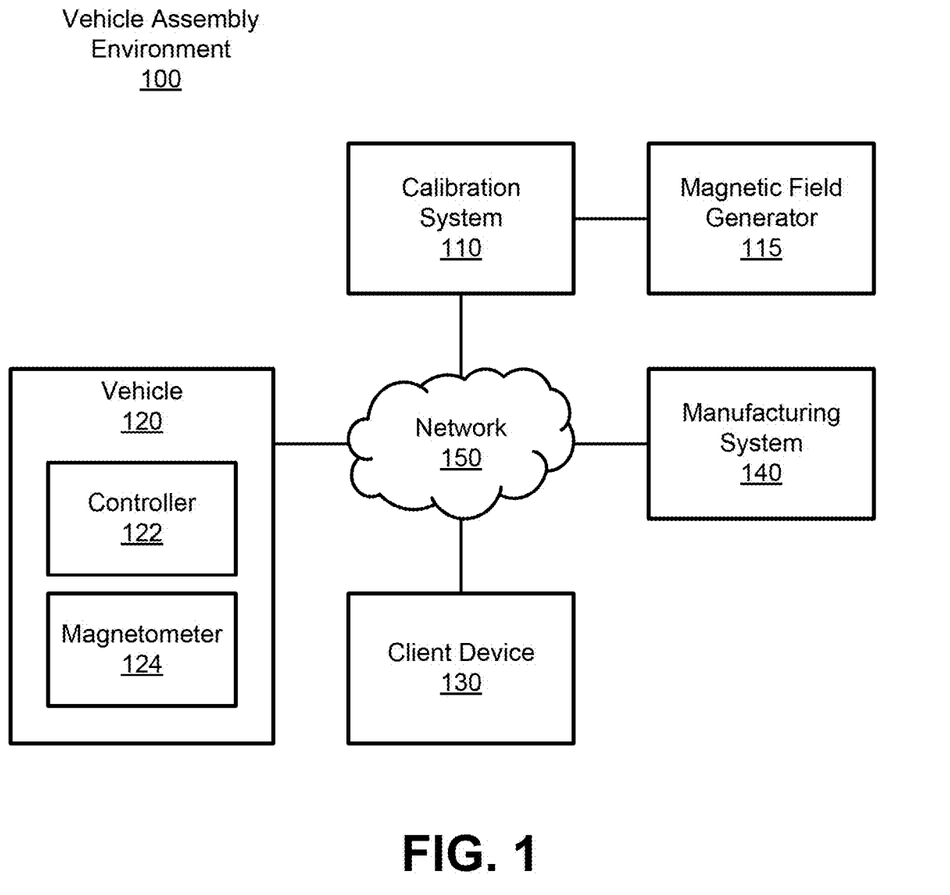
FIG. 1 illustrates a vehicle assembly environment for preparing a vehicle for deployment, in accordance with one or more embodiments.

FIG. 1 illustrates a vehicle assembly environment 100 for preparing a vehicle for deployment, in accordance with one or more embodiments. The environment illustrated in FIG. 1 includes a calibration system 110, a magnetic field generator 115, a vehicle 120, a client device 130, and a manufacturing system 140. Alternative embodiments may include additional, fewer, or different components than those illustrated in FIG. 1, and the functionality of each component may be divided between the components differently from the description below. Additionally, each component may perform their respective functionalities in response to a request from a human, or automatically without human intervention.

The calibration system 110 performs calibration of sensors of the vehicle 120, e.g., a magnetometer 124. The calibration system 110 may be one or more computing devices configured to perform computer-functionality for calibration of the sensors of the vehicle 120. The calibration system 110 may control operation of one or more external devices while the sensors of the vehicle 120 record measurements. Based on the recorded measurements, the calibration system 110 may determine calibration parameters by comparing the recorded measurements against reference data. The calibration system 110 may provide the calibration parameters to the vehicle 120, e.g., to a controller 122 of the vehicle 120, for calibration of the various sensors. In some embodiments, calibration may entail modifying a physical configuration of one or more sensors. In such embodiments, the calibration parameters may indicate the modified physical configuration or instructions to achieving the modified physical configuration. In other embodiments, calibration may entail correcting measurements or readings output by one or more sensors. In such embodiments, the calibration parameters may be stored by the controller 122 of the vehicle 120 for modifying measurements or readings of the one or more sensors.

In one or more embodiments, when calibrating the magnetometer 124, the calibration system 110 may control operation of the magnetic field generator 115. To control operation of the magnetic field generator 115, the calibration system 110 may generate control signals that dictate generation of the magnetic field by the magnetic field generator 115. In one or more embodiments, the magnetic field generator 115 may be component to the calibration system 110. The calibration system 110 receives the magnetometer readings from the magnetometer 124 of the vehicle 120. Based on the magnetometer readings, the calibration system 110 may determine calibration parameters for calibrating the magnetometer 124. The calibration parameters may include a transformation matrix for scaling or skewing the electromagnetic field tensor (i.e., soft iron calibration parameters), an offset matrix for offsetting magnetometer readings (i.e., hard iron calibration parameters), or some combination thereof. The calibration system 110 may further determine multiple sets of calibration parameters, each set of calibration parameters for different configurations of the vehicle 120. For example, a first set of calibration parameters may be determined for a first configuration of the vehicle 120 without a payload, while a second set of calibration parameters may be determined for a second configuration of the vehicle 120 with a payload. The calibration system 110 may provide the calibration parameters to the vehicle 120 for use in calibration of the magnetometer 124. The calibration system 110 may further perform calibration validation to assess the magnetometer readings post-calibration.

The magnetic field generator 115 is a device for generating a magnetic field. The magnetic field generator 115 may generate the magnetic field using electrical components. In one or more embodiments, the magnetic field generator 115 comprises a 3-axis Helmholtz coil device. The 3-axis Helmholtz coil device has three couplets of electrical coils, wherein the electrical coils within each couplet are disposed on parallel planes and coaxial. The three couplets are positioned in a rectilinear configuration, e.g., the axes for the three couplets of coils are orthogonal and intersection at a single point. The electrical coils are positioned apart by a distance sized to fit the vehicle 120, creating a region of highly uniform magnetic field in the space between the electrical coils. By controlling the electrical current flowing through the electrical coils, e.g., using a power supply and a current regulator, the 3-axis Helmholtz coil device can control the magnitude of the generated magnetic field. The strength of the magnetic field can be scaled linearly with the applied current. The direction of the magnetic field can also be reversed by changing the direction of the current. With the three couplets of coils, the device may generate concurrent magnetic fields superimposed to create a net magnetic field along any three-dimensional direction (e.g., which may be expressed in spherical polar coordinates).

In one or more embodiments, the magnetic field generator 115 comprises a single-axis Helmholtz coil device mounted on a three-axis rotation mechanism. The three-axis rotation mechanism may include a plurality of stages, each empowering rotation of the single-axis Helmholtz coil device in one axis of rotation. The stages are nested, such that any orientation in three-dimensional space can be achieved. The three-axis rotation mechanism may include a motor for controlling the rotation of each stage. The motor can orient the single-axis Helmholtz coil device in any orientation in three-dimensional space.

The vehicle 120 a machine designed to transport people or cargo. The vehicle 120 is built from a chassis or a frame for holding the people or cargo, and may also include a propulsion mechanism (e.g., engine, electric motor) for propelling the chassis. The vehicle 120 may further include a steering mechanism for controlling a direction of the vehicle 120. For example, a ground-based vehicle may include wheels for steering the vehicle to make turns. In another example, a water-based vehicle may include a rudder for steering the vehicle. In yet another example, a flying vehicle with wings may include a rudder and/or ailerons to steer the vehicle. In some embodiments, the vehicle 120 is a remote-controlled (RC) vehicle, operated from a distance using a wireless controller. The RC vehicle includes a receiver that receives control signals from a remote transmitter, which are then used to control the vehicle's movement, e.g., controlling propulsion, steering, and other functions. The RC vehicle may include onboard electronics to process the received signals, and one or more actuators that translate those signals into physical actions controlling operation of the RC vehicle. In some embodiments, the vehicle 120 is an autonomous vehicle, i.e., a self-driving vehicle, capable of navigating and operating without human intervention. The autonomous vehicle utilizes a suite of sensors (e.g., cameras, light detection and ranging sensors, a magnetometer, ultrasonic sensors, etc.) to perceive its environment. The vehicle analyzes the sensor data to determine navigation instructions. Based on the navigation instructions, the vehicle can generate control signals for controlling vehicle movement.

In these embodiments, the controller 122 may be implemented as a central computing system to control operation of the one or more sensors and the one or more mechanisms (e.g., the propulsion mechanism, the steering mechanism, etc.). The controller 122 may in communication with other systems. For example, the controller 122 may receive additional sensor data from one or more sensors external to the vehicle 120. The controller 122 may further receive data from the client device 130 modifying operation parameters for the vehicle 120. The controller 122 may also receive calibration parameters for calibrating the various sensors (e.g., including the magnetometer 124) implemented on the vehicle 120.

In some embodiments, the vehicle 120 is configured to hold a payload. In such embodiments, the vehicle 120 may include one or more fastening mechanisms for securing the payload within the vehicle 120 chassis. In some embodiments, the payload may be secured to an external surface of the chassis, e.g., under a wing of a wing-based vehicle, atop a roof of a ground-based vehicle. For example, the vehicle 120 may include one or more compartments designed to hold the payload. In other examples, the vehicle 120 may include brackets, racks, or attachment points for securing payload to the external surface of the chassis. The vehicle 120 may include actuators for controlling securement or release of the payload. The payload may be composed of a material that interferes with one or more sensors of the vehicle 120 (e.g., the magnetometer 124). As such, the calibration system 110 may perform calibration of the one or more sensors to account for the interference of sensor operation by the payload. For example, the payload may be composed of a ferrous material that interferes with the magnetometer 124. Accordingly, the calibration system 110 calibrates the magnetometer 124 to account for the payload's interference of the magnetic field (e.g., hard iron distortion or interference). In one or more embodiments, the vehicle 120 may be configured to secure a payload or to release a payload mid-route. In such embodiments, the one or more sensors may be affected by the changing payload mid-route. To account for the changing configuration, the calibration system 110 may calibrate the sensors to account for the various configurations. For example, the calibration system 110 may calibrate the magnetometer for operation of the vehicle 120 without the payload and may calibrate the magnetometer for operation of the vehicle 120 with the payload. As the load on the vehicle 120 changes, the controller 122 may reconfigure the magnetometer 124 to calibrate the magnetometer for the different configurations. For example, the controller 122 can use a first set of calibration parameters for adjusting magnetometer readings in a configuration with the payload and can use a second set of calibration parameters for adjusting magnetometer readings in a configuration without the payload. If the payload is released, then the controller 122 can swap from the first set of calibration parameters to the second set of calibration parameters. If the payload is secured, then the controller 122 can swap from the second set of calibration parameters to the first set of calibration parameters.

In one or more embodiments, a model may be generated to predict the magnetic interference by the payload. In such embodiments, as the calibration parameters are determined for various configurations of the payload, the model can be refined to predict the magnetic interference for the various configurations. The model may be machine-learning model. The controller 122 may apply the model during deployment of the vehicle 120, such that the controller 122 may adaptively update calibration parameters due to payload reconfiguration.

The controller 122 of the vehicle 120 is a computing system for controlling operation of the vehicle 120. In some embodiments, the controller 122 receives instructions, control signals, sensor, or some combination thereof from external systems or devices. The controller 122 may generate signals for controlling operation of the vehicle 120. For example, received instructions may detail traveling from one position to a second position, changing the payload (e.g., either receiving a payload, or releasing a payload), then traveling from a second position to a third position. The controller 122 may generate control signals for executing the instructions. In such example, the controller 122 can generate control signals for controlling the propulsion mechanism and/or the steering mechanism to control traversal from the first position to the second position. The controller 122 can generate control signals for controlling the fastening mechanism for securement or release of a payload. The controller 122 can generate control signals for controlling the propulsion mechanism and/or the steering mechanism to control traversal from the second position to the third position. The control signals generated at each phase of the vehicle operation may take into account calibration parameters specific to the vehicle configuration during that phase.

The controller 122 may also communicate data to other devices. The controller 122 may, during the calibration process, communicate sensor data comprising measurements or readings to the calibration system 110. The controller 122 may also receive calibration parameters from the calibration system 110. The controller 122 may also receive instructions or other data from the client device 130. For example, in the context of an RC vehicle, the client device 130 may provide control signals for controlling operation of the vehicle 120.

The magnetometer 124 is a sensor for measuring a magnetic field experience by the vehicle 120. The magnetometer 124 operates by measuring the magnetic field using sensors that detect changes in magnetic flux density. For example, the sensors may be Hall effect sensors, which measure the voltage generated when a current-carrying conductor is placed in a magnetic field, fluxgate magnetometers, which utilize a highly permeable core to detect changes in magnetic flux, or some other magnetic-sensitive sensor. When a magnetic field is present, the field interacts with the magnetometer's components, inducing a measurable signal proportional to the field's strength and direction. The magnetometer may process and convert the electrical signal into a digital or analog output, providing a quantitative measurement of the surrounding magnetic field. In some embodiments, calibration parameters may be used by the magnetometer to account for soft iron or hard iron distortions when outputting the magnetometer readings. The magnetometer readings may be used to determine a global heading for the vehicle 120, i.e., an orientation of the vehicle 120 relative to the Earth's gravitational field. The global heading may be used in determining navigation instructions for the vehicle 120.

The client device 130 is a computing system or device by which an operator may interact with other components, e.g., the calibration system 110, the vehicle 120, the manufacturing system 140. The client device 130 can be a personal or mobile computing device, such as a smartphone, a tablet, a laptop computer, or desktop computer. In some embodiments, the client device 130 executes a client application that uses an application programming interface (API) to communicate with the other components.

In one or more embodiments, the client device 130 is used in controlling operation of the calibration system 110 and/or the manufacturing system 140. In such embodiments, the client device 130 may be used to provide instructions to the other systems. The instructions may provide details on how to manufacture or assemble the vehicle 120. For example, the client device 130 may provide a blueprint of the vehicle 120 to be manufactured by the manufacturing system 140. The manufacturing system 140 may generate manufacturing instructions based on the blueprint to manufacture components of the vehicle 120, to assemble components of the vehicle 120, to implement electronics or other components, etc. The client device 130 may also interface with the calibration system 110 for controlling the calibration process. In some embodiments, the calibration system 110 may provide updates on the calibration process to the client device 130. In some embodiments, the calibration system 110 may generate a calibration profile for the vehicle 120, which may be viewed by the client device 130. In some embodiments, the calibration system 110 may provide a report on the calibration process, e.g., indicating precision in the vehicle's sensors pre-calibration or post-calibration.

In one or more embodiments, the client device 130 may be used in controlling operation of the vehicle 120. For example, the client device 130 may transmit instructions, control signals, or data to the vehicle 120 for controlling the operation of the vehicle 120. For example, in an RC vehicle embodiment, the client device 130 may include an electronic display for presentation of live feed of a camera system on the vehicle 120. The operator may use the live feed to navigate the vehicle 120 in real-time. Other example sensor data streams may be used, either in conjunction with the camera system's live feed or alternatively. The client device 130 may, in such embodiments, generate a graphical user interface for conveying information from the vehicle 120 and for inputting instructions for controlling operation of the vehicle 120. For example, the graphical user interface may include virtual elements for controlling the propulsion mechanism, the steering mechanism, the fastening mechanism for payload release, etc. As the vehicle 120 continues operation, the graphical user interface presented by the client device 130 may provide a real-time status of the vehicle 120 (e.g., including global heading, global position of the vehicle 120, velocity, acceleration, etc.).

The manufacturing system 140 includes one or more machines for manufacturing the vehicle 120. The manufacturing system 140 may integrate automated machines, semi-automated machines, or manual machines to transform raw materials into finished vehicles. Initially, raw materials like steel, aluminum, and plastics are formed into individual components using processes such as stamping, casting, and molding, e.g., which may be executed by robotic machines. These parts are then transferred to assembly lines, where robotic systems and/or human workers assemble them together, e.g., utilizing techniques like welding, bolting, adhesive bonding, etc. Machines and/or workers may integrate electronics into the subassembly, involving automated placement, soldering of circuit boards, wiring harnesses, and implementation of sensors onto vehicle subassemblies. The manufacturing system 140 may also include machines or robots for translocating parts or subassemblies from machine to machine. For example, the manufacturing system 140 may include one robot for placement of the vehicle 120 or the subassembly onto the calibration system's magnetic field generator, e.g., in the context of magnetometer calibration.

Throughout the manufacturing process, the manufacturing system 140 may include machines for measuring characteristics of the subassembly, i.e., for assessing quality control. For example, camera systems or laser scanners can be used to assess dimensional accuracy to a blueprint and structural integrity of formed parts. The manufacturing system 140 may further include machines for testing of completed vehicles, including functional checks of all systems and performance evaluations. In some embodiments, the manufacturing system 140 includes a machine for loading a payload onto the vehicle 120. This manufacturing system 140 may further include one or more central computing systems for controlling operation of the various machines to achieve high precision along the manufacturing process. The results of the tests or checks may be collated into a report for presentation to a manufacturing operator overseeing the process.

The components of the vehicle assembly environment 100 can communicate with each other via the network 150. The network 150 is a collection of computing devices that communicate via wired or wireless connections. The network 150 may include one or more local area networks (LANs) or one or more wide area networks (WANs). The network 150, as referred to herein, is an inclusive term that may refer to any or all of standard layers used to describe a physical or virtual network, such as the physical layer, the data link layer, the network layer, the transport layer, the session layer, the presentation layer, and the application layer. The network 150 may include physical media for communicating data from one computing device to another computing device, such as multiprotocol label switching (MPLS) lines, fiber optic cables, cellular connections (e.g., 3G, 4G, or 5G spectra), or satellites. The network 150 also may use networking protocols, such as TCP/IP, HTTP, SSH, SMS, or FTP, to transmit data between computing devices. In some embodiments, the network 130 may include Bluetooth or near-field communication (NFC) technologies or protocols for local communications between computing devices. The network 150 may transmit encrypted or unencrypted data.

Calibration System

Figure 2:
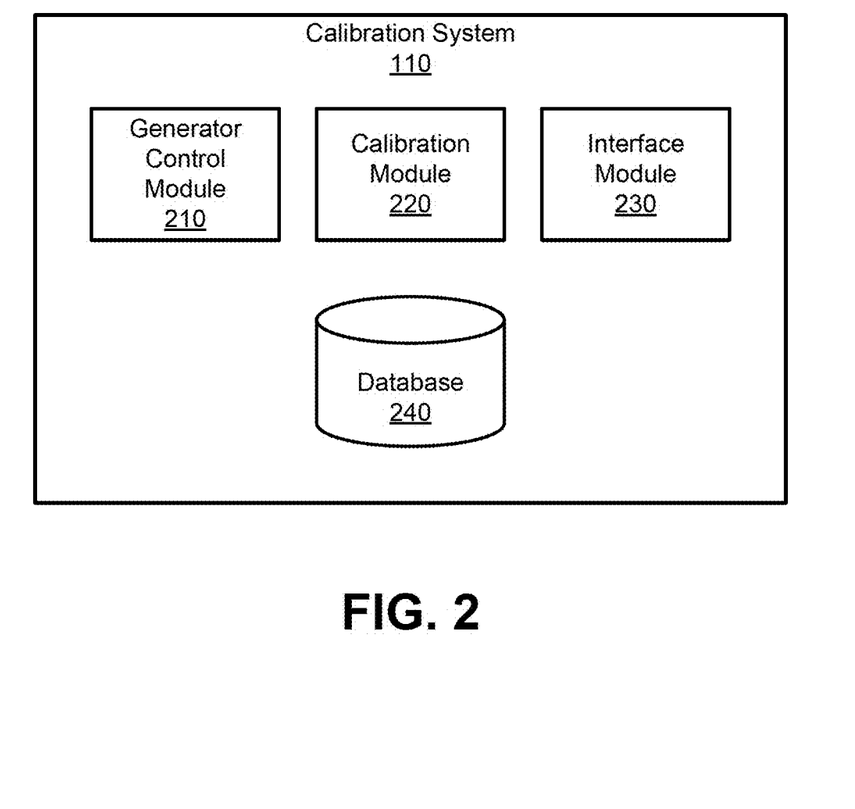
FIG. 2 is a block diagram of a calibration system, in accordance with one or more embodiments.

FIG. 2 is a block diagram of a calibration system 110, in accordance with one or more embodiments. The calibration system 110 performs calibration of the sensors of a vehicle (e.g., the vehicle 120 of FIG. 1), leveraging a magnetic field generator (e.g., the magnetic field generator 115 of FIG. 1) to generate different reference magnetic fields. In one or more embodiments, the calibration system 110 includes a generator control module 210, a calibration module 220, a vehicle interface module 230, and a database 240. In other embodiments, the calibration system 110 may include additional modules (e.g., modules for calibration of other sensors of the vehicle), fewer modules, different modules, or some combination thereof. In other embodiments, the functionality of the various modules may be disparately distributed across modules or across other external systems or devices.

The generator control module 210 controls operation of the magnetic field generator to generate a magnetic field around the vehicle's magnetometer. The generator control module 210 may follow a preset procedure for generating the reference magnetic field. For example, the procedure may include generating a first magnetic field along one principal axis, i.e., the vehicle's longitudinal axis extending from an aft end through the vehicle's center to a fore end. The procedure may include generating a second magnetic field along a second principal axis, i.e., the vehicle's lateral axis extending from one lateral side through the vehicle's center to the other side. The procedure may include generating a third magnetic field along a third principal axis, i.e., the vehicle's vertical axis extending from the bottom side through the vehicle's center to the top side. In some embodiments, the procedure may include generating a rotating magnetic field within a single plane. In embodiments with a 3-axis Helmholtz coil device, to generate the rotating magnetic field, the generator control module 210 may generate control signals to generate superimposing magnetic fields by two or more couplets of coils of the device. By adjusting strength of the magnetic fields generated by the couplets of coils, the net magnetic field can be oriented in any spatial direction. The procedure may also include adjusting strength of the magnetic field to assess sensitivity in the magnetometer.

In some embodiments, the generator control module 210 may further control other components of the magnetic field generator. For example, the magnetic field generator may include one or more components for positioning the vehicle prior to performing the calibration procedure. In such embodiments, the generator control module 210 may generate control signals for controlling the components.

The calibration module 220 determines the calibration parameters based on magnetometer readings by the vehicle's magnetometer referenced against the calibration procedure performed by the generator control module 210. The calibration module 220 may determine the calibration parameters by evaluating the magnetometer readings against the reference magnetic field generated by the generator control module 210. The calibration module 220 receives the magnetometer readings from the vehicle's magnetometer. The magnetometer readings may include a strength of the magnetic field (e.g., measured in Tesla, Gauss, Amperes per meter, etc.) and a direction of the magnetic field (e.g., measured in Cartesian coordinates or spherical polar coordinates) as measured by the magnetometer. In soft iron calibration, the calibration module 220 seeks to account for distortions in the magnetic field due to interaction of ferromagnetic materials altering the shape of the magnetic field. The calibration module 220 may generate a correction matrix for scaling or skewing magnetometer readings to account for the soft iron distortions, i.e., transforming the skewed distribution into a spherical distribution.

In hard iron calibration, the calibration module 220 may calibrate for distortions in the magnetic field due to permanent magnetic fields generated by nearby ferromagnetic materials implemented on the vehicle. The calibration module 220 may generate an offset matrix with values to offset shifted magnetometer readings due to the hard iron distortions. In some embodiments, the calibration module 220 generates calibration parameters for the vehicle's controller to calibrate the magnetometer. The calibration parameters may include the correction matrix and/or the offset matrix. The calibration parameters may be stored by the vehicle's controller for correction of the magnetometer readings. In other embodiments, the calibration parameters may be used to reconfigure the magnetometer, such that the magnetometer outputs calibrated readings.

The calibration module 220 may perform vehicle-aware calibration, taking into account the vehicle's specific characteristics, operational context, configuration, or current state. In such embodiments, the calibration module 220 may provide information on the calibration procedure to the vehicle's controller. The vehicle's controller may leverage the information to dynamically calibrate the one or more sensors, e.g., by modifying the configuration as the calibration procedure progresses. In such embodiments, the calibration module 220 may send to the vehicle's controller an error between the magnetometer readings and the reference magnetic field as the calibration procedure is progressing. The vehicle's controller may perform real-time calibration of the magnetometer.

In some embodiments, the calibration module 220 may perform calibration validation to validate the sensors are appropriately calibrated. The calibration module 220 may transmit to the vehicle's controller the calibration parameters for calibrating the one or more sensors. The vehicle's controller calibrates the one or more sensors with the calibration parameters. The vehicle's controller can provide indication to the calibration system 110 of the completed calibration. Following that indication, the calibration module 220 may perform a calibration validation procedure, crosschecking the sensor readings against another set of referential measurements. For example, the calibration module 220 may instruct the generator control module 210 to generate additional reference magnetic fields to validate the magnetometer's calibration. The calibration module 220 may determine an error between the magnetometer's calibrated readings and the reference magnetic fields. If the error is above a threshold, the calibration module 220 may fail the validation. If the error is below a threshold, the calibration module 220 may pass the validation. A failed validation may trigger remedial workflows, e.g., reperforming calibration, notifying an operator, marking the vehicle as unready for deployment, etc.

The calibration module 220 may further generate a calibration profile for each vehicle calibrated. The calibration profile may include information on the calibration parameters, validation results, other information related to sensor configurations, or some combination thereof. The calibration module 220 may generate the calibration profile to be viewable as a report by a human operator. In such embodiments, the information may be converted into visual representations, providing the operator with readability ease. Each calibration profile may be stored in the database 240 for each vehicle.

The interface module 230 interfaces with other systems or devices. In one or more embodiments, the interface module 230 receives data from a vehicle being calibrated. The interface module 230 may further provide calibration parameters or information regarding the calibration procedure to the vehicle controller. In one or more embodiments, the interface module 230 communicates with a client device operated by an operator overseeing the calibration procedure. The interface module 230 may generate a graphical user interface for presenting information on the calibration procedure, for example, the graphical user interface may present real-time updates on the generation of a referential magnetic field and real-time readings received from the vehicle's magnetometer.

The database 240 stores data used by the calibration system 110. The database 240 may be a structured data storage medium. The database 240 can be organized for efficient storage, retrieval, and management. The database 240 may include referential tables, composed of rows (representing records or entities) and columns (representing attributes or characteristics of those entities). Other non-table-based storage architectures may also be used. The database 240 may be managed by a database management system (DBMS), which provides tools and functionalities for defining the database schema, writing data into the database 240, deleting data from the database 240, modifying data in the database 240, querying and retrieving data from the database 240, maintaining data security and integrity, managing concurrent access by multiple users or applications, or some combination thereof. In one or more embodiments, the database 240 may store information on calibration procedures for use in calibrating one or more sensors of a vehicle. The database 240 may also information on vehicles calibrated by the calibration system 110, e.g., a calibration profile generated per vehicle. The database 240 may also store models used by the calibration module 220 for determining calibration parameters for the vehicle.

Magnetic Field Generator

Figure 3A:
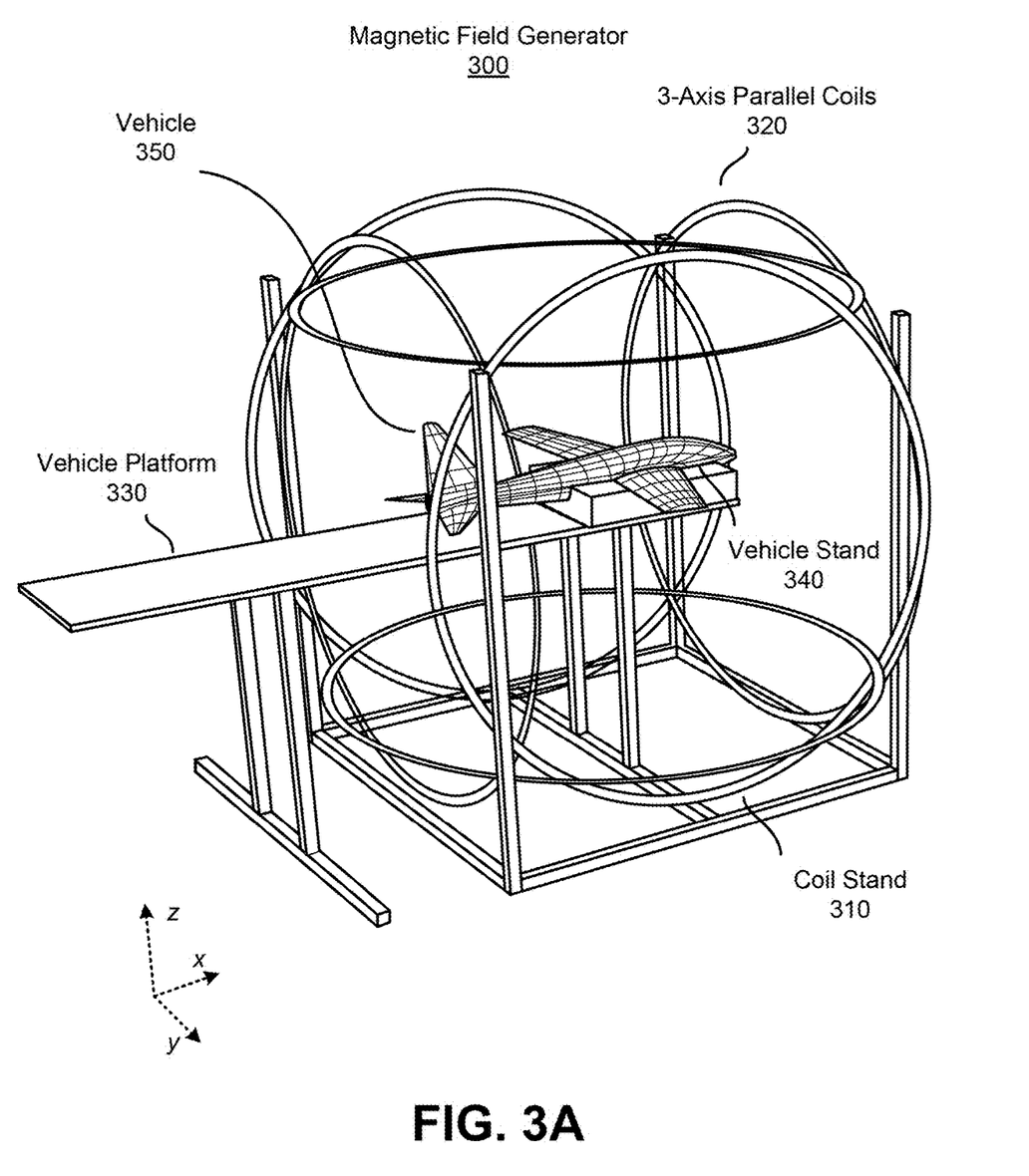
FIG. 3A illustrates a perspective view of a magnetic field generator implemented with 3-axis Helmholtz coils, in accordance with one or more embodiments.
Figure 3B:
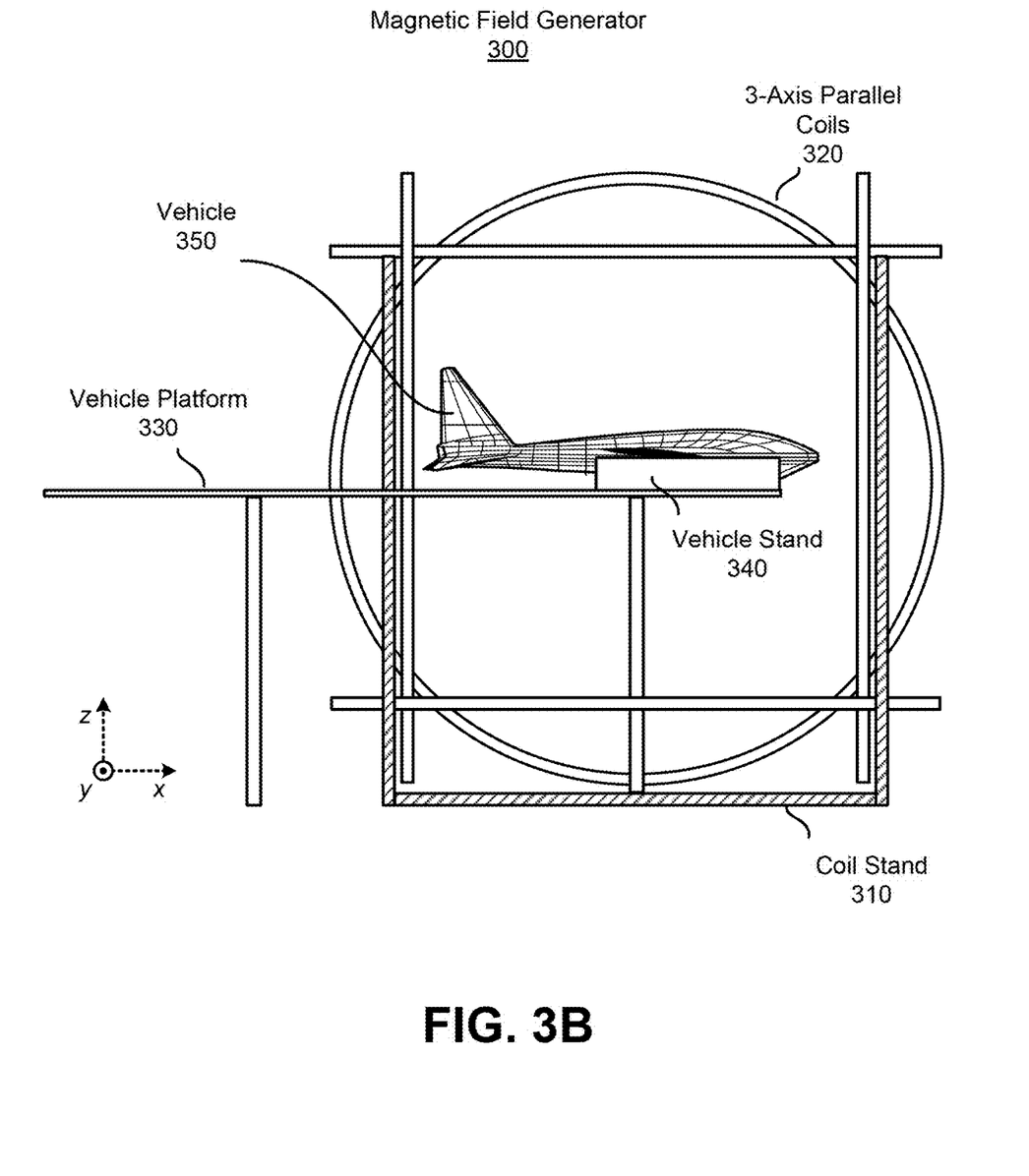
FIG. 3B illustrates a top-down view of a magnetic field generator implemented with 3-axis Helmholtz coils, in accordance with one or more embodiments.
Figure 3C:
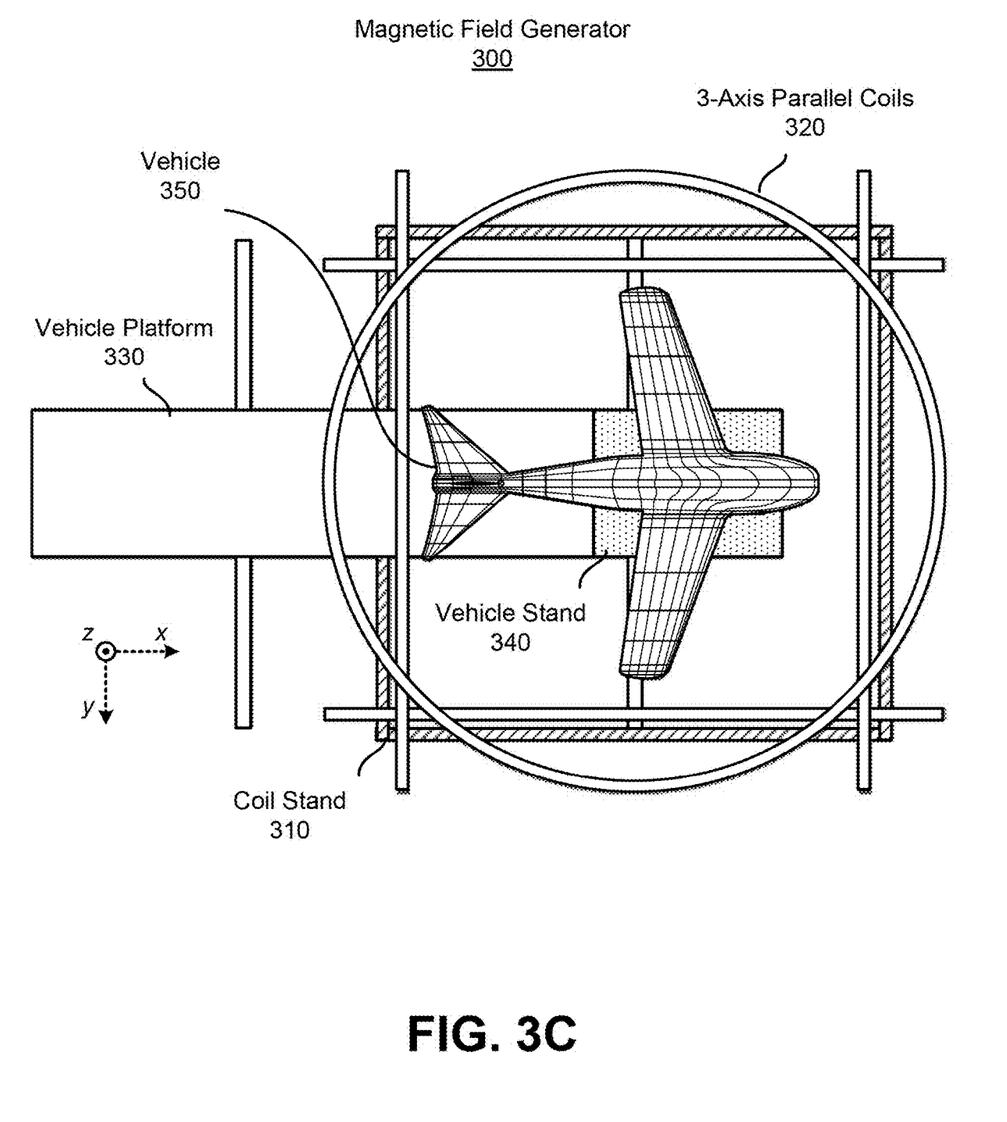
FIG. 3C illustrates a top-down view of a magnetic field generator implemented with 3-axis Helmholtz coils, in accordance with one or more embodiments.
Figure 3D:
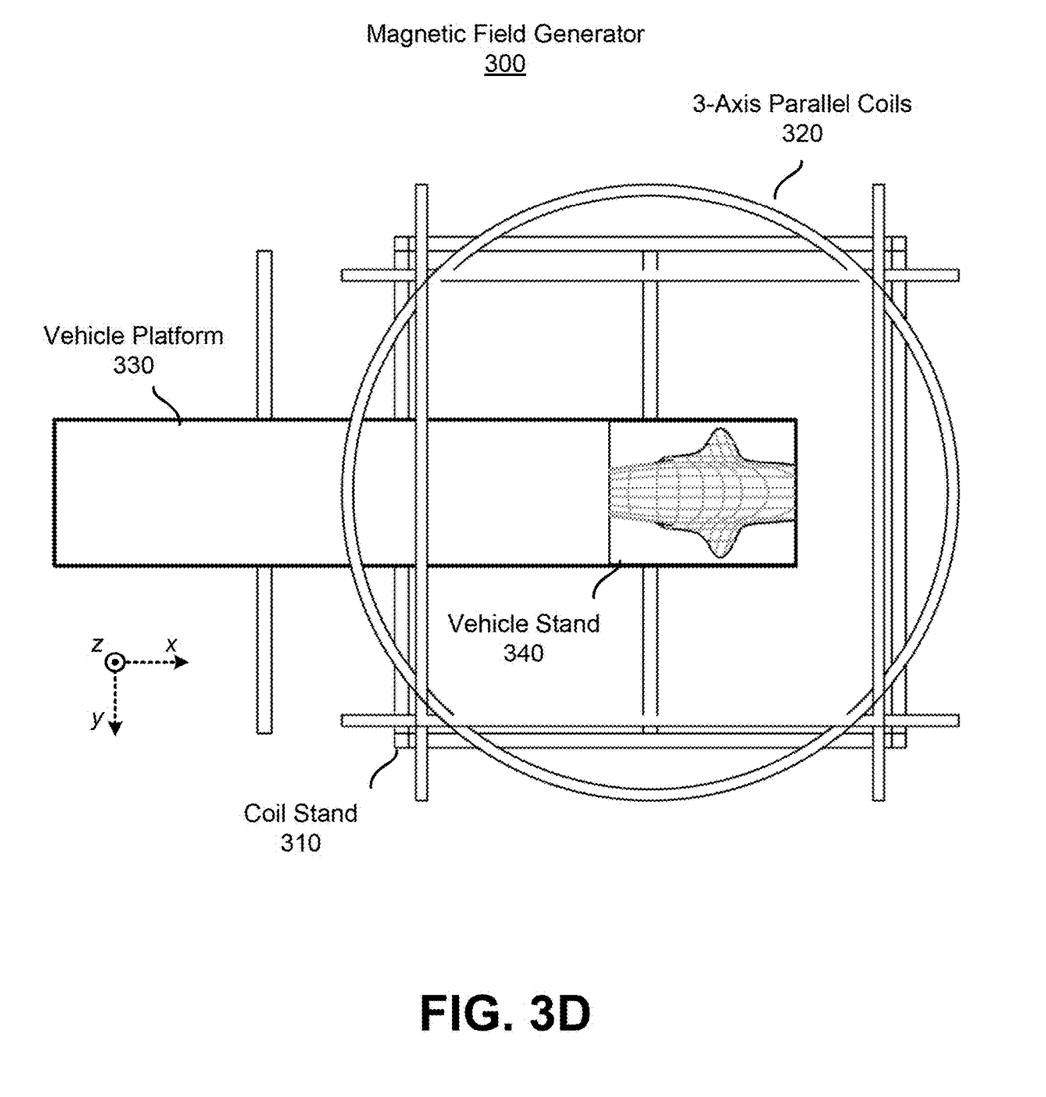
FIG. 3D illustrates a top-down view of a magnetic field generator implemented with 3-axis Helmholtz coils without vehicle, in accordance with one or more embodiments.
Figure 3E:
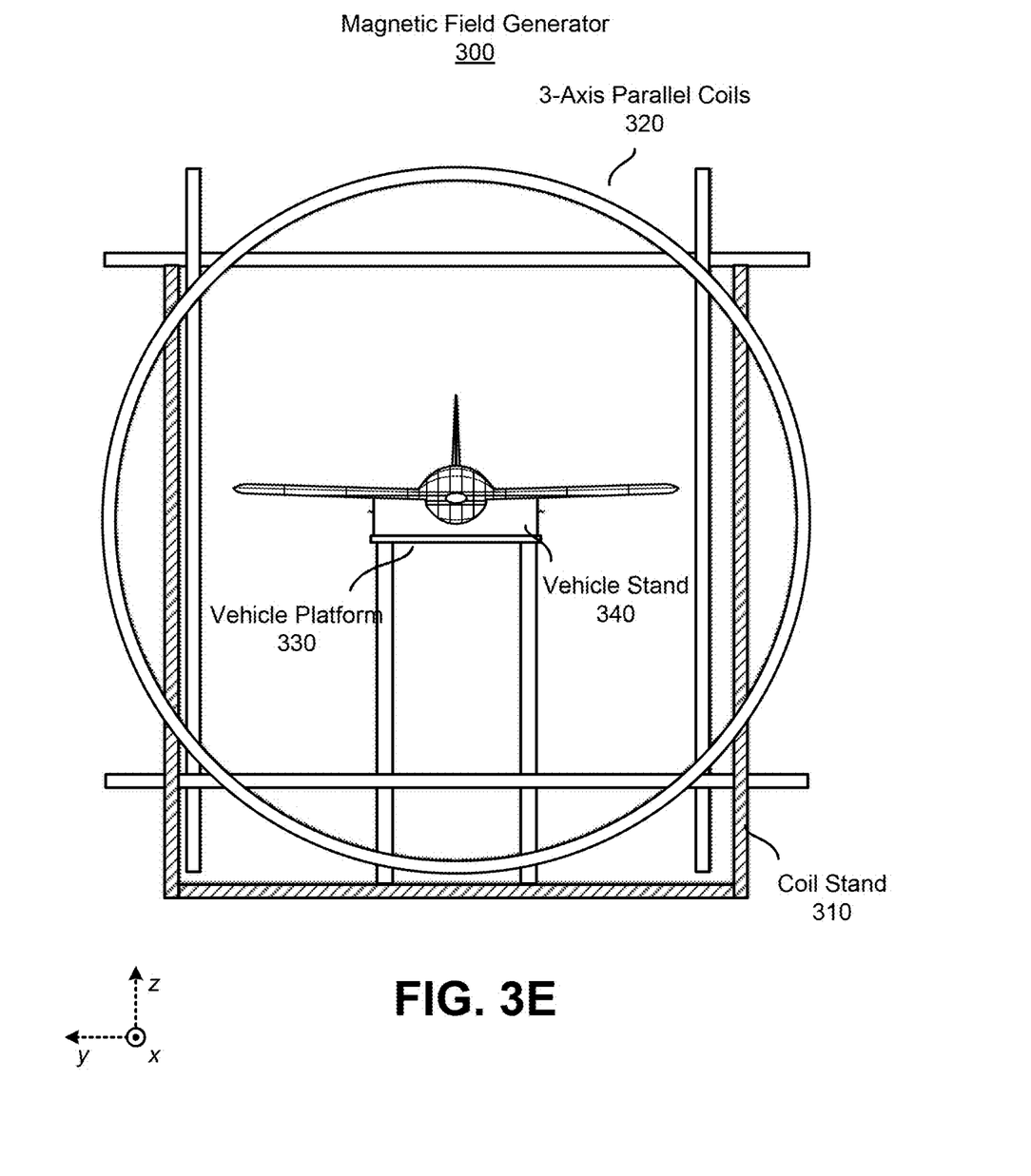
FIG. 3E illustrates a frontal view of a magnetic field generator implemented with 3-axis Helmholtz coils, in accordance with one or more embodiments.

FIGS. 3A-3E illustrate various views of a magnetic field generator 300 implemented with 3-axis Helmholtz coils. The magnetic field generator 300 is an embodiment of the magnetic field generator 115 of FIG. 1. FIG. 3A illustrates a perspective view of a magnetic field generator 300 implemented with 3-axis Helmholtz coils, in accordance with one or more embodiments. FIG. 3B illustrates a top-down view of a magnetic field generator 300 implemented with 3-axis Helmholtz coils, in accordance with one or more embodiments. FIG. 3C illustrates a top-down view of a magnetic field generator 300 implemented with 3-axis Helmholtz coils, in accordance with one or more embodiments. FIG. 3D illustrates a top-down view of a magnetic field generator 300 implemented with 3-axis Helmholtz coils without vehicle, in accordance with one or more embodiments. FIG. 3E illustrates a frontal view of a magnetic field generator 300 implemented with 3-axis Helmholtz coils, in accordance with one or more embodiments. Although the figures illustrate a wing-based flying vehicle as vehicle 350, the magnetic field generator 300 may be configured for calibration of magnetometers in other vehicle types. In such embodiments, varying components may be adapted to fit the particular form factor of the vehicle type being calibrated.

The magnetic field generator 300 includes a coil stand 310 for supporting the 3-axis parallel coils 320, the 3-axis parallel coils 320, a vehicle platform 330 for supporting the vehicle stand 340 which holds the vehicle 350 in the appropriate position for magnetometer calibration.

The coil stand 310 is a frame for supporting the 3-axis parallel coils 320. The coil stand 310 may be composed of a strong, rigid material, e.g., metal alloys, concrete, thermoplastics, etc. As illustrated, the coil stand 310 includes a square base with four vertically-extending support structures positioned at each corner of the square base. The 3-axis parallel coils 320 are supported by the four-vertically extending support structures.

The 3-axis parallel coils 320 are used to generate uniform magnetic fields in the volume within the 3-axis parallel coils 320. Here, there are six coils. Each coil is identically sized as the other coils. Each coil is also circular in shape. In other embodiments, differentially-sized coils or differentially-shaped coils may be implemented. Coils in each pair are disposed coaxially with the center of the two coils aligned along the principal axes of the vehicle 350, i.e., the longitudinal axis, the lateral axis, and the vertical axis. The coils are also perpendicular to the respective principal axis.

To generate a magnetic field in the volume within the 3-axis parallel coils 320, an electrical current is applied to the coils. Current applied through a coil generates a magnetic field radially emanating from the direction of current. The net magnetic field generated when current is applied through one coil creates a magnetic field perpendicular to the coil, i.e., coaxial to the coil. Leveraging parallel coils in a coaxial configuration further promotes generation of a uniformly linear magnetic field generated between the parallel coils. To control strength of the magnetic field, the magnetic field generator 300 controls the voltage applied through the coils. The generated magnetic field is linearly proportional to the voltage applied. Leveraging the three couplets of coils, the magnetic field generator 300 may generate multiple magnetic fields concurrently via two or three of the couplets of coils. The superimposition of the magnetic fields creates a net magnetic field in any spatial direction within the volume.

In one or more embodiments, the coils are sized to be bigger than the vehicle 350. In the embodiment shown with the vehicle 350 as a wing-based flying vehicle, the coils have a diameter that is greater than the wingspan of the vehicle 350. A diameter that is greater than the wingspan of the vehicle 350 provides for the ability to move the vehicle 350 into and out of a center of the 3-axis parallel coils 320.

In one or more embodiments, the coils may be sized smaller, e.g., of a similar size to the vehicle 350. In such embodiments, the 3-axis parallel coils 320 may be bifurcated, with pins along the bisection plane for reconnecting the coils. Bifurcation along a plane perpendicular to one principal axis would create junctions between two couplets of coils. For example, if the 3-axis parallel coils 320 are bifurcated along a vertical plane perpendicular to the lateral axis, then the parallel coils perpendicular to the vertical axis and the parallel coils perpendicular to the longitudinal axis would have junctions to couple and decouple the coils together. Each junction would include complementary connectors on either side of the coil, that would join together to reestablish electrical connection in the bifurcated coils. Each connector may include sufficient pins for the number of turns of the electrical coil. In such embodiments, the coil stand 310 may also be bifurcated with a fastening mechanism to secure the two halves together.

The vehicle platform 330 is a structure for supporting the vehicle stand 340 and the vehicle 350. In some embodiments, the vehicle platform 330 includes a planar surface for sliding the vehicle stand 340 from a loading position to a testing position. The vehicle platform 330 may include tracks for constraining movement of the vehicle stand 340. The vehicle platform 330 may include one or more actuators for controlling the position of the vehicle stand 340.

The vehicle stand 340 is a structure for supporting the vehicle 350. The vehicle stand 340 is disposed on the vehicle platform 330. The vehicle stand 340 includes one or more structural features for constraining a position of the vehicle 350 when loaded onto the vehicle stand 350. For example, as shown in FIG. 3D, the vehicle stand 340 may include an indentation fitted to an underside or a bottom surface of the vehicle 350. The vehicle 350 rests in the indentation, in a snug fit, to constrain any stray movements of the vehicle during the calibration procedure. In some embodiments, the vehicle stand 340 may be configured to move between a loading position for loading the vehicle 350 onto the vehicle stand 340 and a testing position where a loaded vehicle 350 is positioned in the volume within the 3-axis parallel coils 320. In such embodiments, the vehicle stand 340 may include one or more wheels that couple to tracks on the vehicle platform 330. The wheels empower movement along the tracks from the loading position to and/or from the testing position.

In one or more embodiments, the magnetic field generator 300 may include one or more automated components. For example, the magnetic field generator 300 may include actuators for positioning the vehicle 350 at the testing position within the magnetic field generator 300. To validate proper positioning of the vehicle 350, the magnetic field generator 300 may include one or more devices for performing the positioning validation. In one or more embodiments, an imaging system (comprising one or more cameras) may be mounted on magnetic field generator 300 and configured to capture images of the vehicle 350. The imaging system may ascertain from the image data, a pose of the vehicle 350 relative to the imaging system. The vehicle 350 may further include fiducials to aid with the pose determination. The pose of the vehicle 350 can be checked against the positioning appropriate for the calibration procedure. In other embodiments, the magnetic field generator may include a ranging and detection sensor (e.g., light ranging and detector (LiDAR), radio ranging and detection (RADAR), etc.) for use in determining depth of one or more surfaces of the vehicle 350. The depth of the surfaces can be used to determine the pose of the vehicle 350. In other embodiments, a contact sensor (e.g., a capacitive sensor, an electrical contact pad, etc.) can be used to detect contact of the vehicle 350 in the vehicle stand 340, as a proxy for validating the positioning of the vehicle 350. In other embodiments, some combination of the above principles can be applied to validate the positioning of the vehicle 350 relative to the magnetic field generator 300. The automated components may also be used for loading or unloading a payload on the vehicle 350. Accordingly, the magnetic field generator 300 may be used to calibrate the vehicle 350 in different configurations of the vehicle 350.

Example Method(s)

Figure 4:
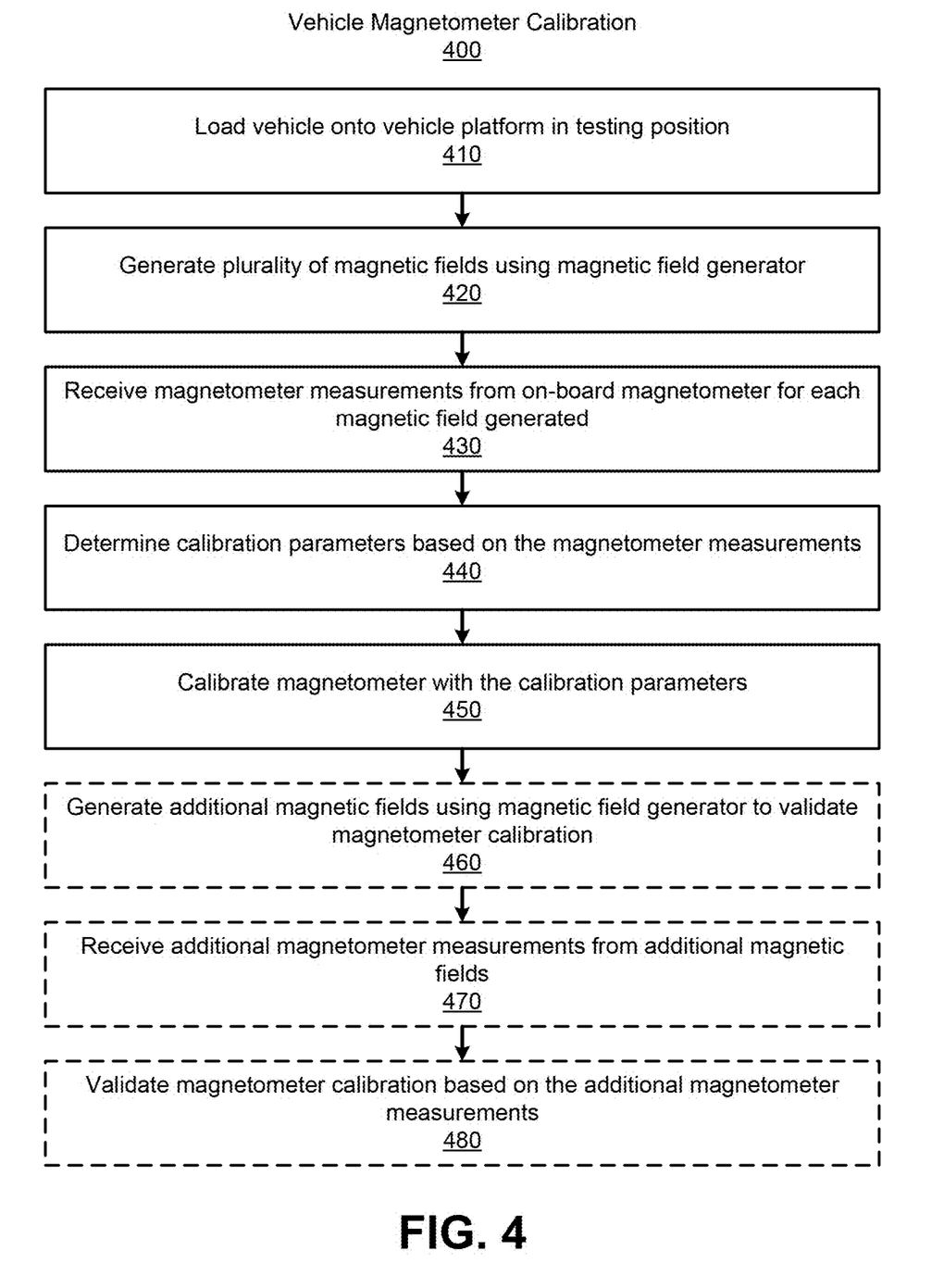
FIG. 4 is a flowchart describing a process of vehicle magnetometer calibration, in accordance with one or more embodiments.

FIG. 4 is a flowchart describing a process 400 of vehicle magnetometer calibration, in accordance with one or more embodiments. The process 400 may be performed by a calibration system (e.g., the calibration system 110 of FIG. 1), e.g., in conjunction with a magnetic field generator and/or the vehicle's controller. In other embodiments, the process 400 may include additional steps, fewer steps, different steps, or some combination thereof in consonance with this disclosure.

The calibration system loads 410 the vehicle onto a vehicle platform in a testing position. In some embodiments, the calibration system, or another system, may include one or more automated components to aid in the loading step. The automated components may include actuators for affixing the vehicle onto the vehicle platform. In some embodiments, the vehicle platform may include a stand with an indentation that complements an underside of the vehicle. In some embodiments, the calibration system includes one or more automated components that may aid in loading, unloading, or changing a position of a payload for the vehicle, e.g., while loaded on the vehicle platform. In other embodiments, a human operator may intervene to perform or to aid in performance of the loading of the vehicle.

The calibration system generates 420 a plurality of magnetic fields using the magnetic field generator, as the vehicle's magnetometer records measurements of the magnetic field during the calibration procedure. The magnetic field generator may be a 3-axis Helmholtz coil device, e.g., as embodied in FIGS. 3A-3E. The magnetic field generator may be used to generate different magnetic fields for calibration testing. The calibration system may toggle the direction of the magnetic field, the strength of the magnetic field, etc. For example, the calibration system may rotate the magnetic field about any axis in three-dimensional space. As the reference magnetic fields are generated, the vehicle's magnetometer measures characteristics of the magnetic field, e.g., the strength and the direction of the magnetic field.

The calibration system receives 430 the magnetometer measurements from the on-board magnetometer for each magnetic field generated. The magnetometer measurements may be in a time series format. The calibration system aligns the time series to the referential magnetic field generated by the magnetic field generator.

The calibration system determines 440 calibration parameters based on the magnetometer measurements. At one or more of the time points, the calibration system may calculate an error between the measurement and the reference magnetic field. The calibration system may determine calibration parameters to minimize the errors. In some embodiments, the calibration parameters may include a correction matrix for soft iron calibration and an offset matrix for hard iron calibration.

The calibration system calibrates 450 the magnetometer with the calibration parameters. Calibration may entail storing the calibration parameters on-board the vehicle, e.g., at the vehicle's controller, or magnetometer. The calibration parameters may reconfigure the magnetometer such that outputs by the magnetometer are calibrated. In other embodiments, the calibration parameters may be used to correct outputs by the magnetometer. The calibration system may generate a calibration profile specific to the magnetometer, indicating how the calibration parameters calibrate the particular magnetometer.

The calibration system may perform multiple calibration procedures based on varying configurations of the vehicle. Different configurations can affect the soft iron or hard iron distortions of the magnetic flux around the magnetometer. As such, the calibration system may be used to generate calibration parameters for different configurations. The different sets of calibration parameters may be toggled between such that the vehicle's magnetometer is appropriately calibrated during deployment even as the vehicle configuration changes. For example, the calibration system may move the vehicle from the testing position to a loading position. In the loading position, the payload may be altered. Then the calibration system moves the vehicle from the loading position back into the testing position to perform another iteration of calibration.

The calibration system may further validate the calibration of the magnetometer.

The calibration system may generate 460 additional magnetic fields using the magnetic field generator to validate the magnetometer calibration. In some embodiments, the additional magnetic fields may be different from the initial magnetic fields generated when calibrating the magnetometer. The vehicle's magnetometer measures the magnetic field during the validation procedure.

The calibration system may receive 470 the additional magnetometer measurements during the generation of the additional magnetic fields. The calibration system may process the magnetometer measurements, e.g., aligning the measurements time series to the referential magnetic field generated to validate the magnetometer's calibration.

The calibration system may validate 480 the magnetometer calibration based on the additional magnetometer measurements. The calibration system may determine an error between the additional measurements against the referential magnetic field. If the error is above a threshold, then the calibration system may fail the validation. If the error is below the threshold, then the calibration system may pass the validation. A failed validation may trigger a remedial workflow, e.g., recalibrating, notifying an operator, tagging the vehicle's magnetometer as unready for deployment, etc.

ADDITIONAL CONSIDERATIONS

The foregoing description of the embodiments has been presented for the purpose of illustration; many modifications and variations are possible while remaining within the principles and teachings of the above description.

Any of the steps, operations, or processes described herein may be performed or implemented with one or more hardware or software modules, alone or in combination with other devices. In some embodiments, a software module is implemented with a computer program product comprising one or more computer-readable media storing computer program code or instructions, which can be executed by a computer processor for performing any or all of the steps, operations, or processes described. In some embodiments, a computer-readable medium comprises one or more computer-readable media that, individually or together, comprise instructions that, when executed by one or more processors, cause the one or more processors to perform, individually or together, the steps of the instructions stored on the one or more computer-readable media. Similarly, a processor may comprise one or more subprocessing units that, individually or together, perform the steps of instructions stored on a computer-readable medium.

Embodiments may also relate to a product that is produced by a computing process described herein. Such a product may store information resulting from a computing process, where the information is stored on a non-transitory, tangible computer-readable medium and may include any embodiment of a computer program product or other data combination described herein.

The description herein may describe processes and systems that use machine-learning models in the performance of their described functionalities. A "machine-learning model," as used herein, comprises one or more machine-learning models that perform the described functionality. Machine-learning models may be stored on one or more computer-readable media with a set of weights. These weights are parameters used by the machine-learning model to transform input data received by the model into output data. The weights may be generated through a training process, whereby the machine-learning model is trained based on a set of training examples and labels associated with the training examples. The training process may include: applying the machine-learning model to a training example, comparing an output of the machine-learning model to the label associated with the training example, and updating weights associated for the machine-learning model through a back-propagation process. The weights may be stored on one or more computer-readable media, and are used by a system when applying the machine-learning model to new data.

The language used in the specification has been principally selected for readability and instructional purposes, and it may not have been selected to narrow the inventive subject matter. It is therefore intended that the scope of the patent rights be limited not by this detailed description, but rather by any claims that issue on an application based hereon.

As used herein, the terms "comprises," "comprising," "includes," "including," "has," "having," or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive "or" and not to an exclusive "or". For example, a condition "A or B" is satisfied by any one of the following: A is true (or present) and B is false (or not present); A is false (or not present) and B is true (or present); and both A and B are true (or present). Similarly, a condition "A, B, or C" is satisfied by any combination of A, B, and C being true (or present). As a not-limiting example, the condition "A, B, or C" is satisfied when A and B are true (or present) and C is false (or not present). Similarly, as another not-limiting example, the condition "A, B, or C" is satisfied when A is true (or present) and B and C are false (or not present).

What is claimed is:

1. A calibration system comprising:
   a vehicle platform for supporting a vehicle with a magnetometer implemented on board the vehicle;
   a magnetic field generator configured to generate a referential magnetic field in three-dimensional space for calibration of the magnetometer on-board the vehicle;
   a computing device configured to:
   receive magnetometer measurements from the magnetometer on-board the vehicle during generation of the referential magnetic field, and
   determine calibration parameters for calibrating the magnetometer based on the magnetometer measurements and the referential magnetic field generated by the magnetic field generator.

2. The calibration system of claim 1, wherein the magnetic field generator comprises a plurality of coils disposed in three orthogonal axes.

3. The calibration system of claim 2, wherein the plurality of coils includes three couplets of coils, wherein the coils of each couplet are parallel to one another, wherein each couplet is positioned on one of the three orthogonal axes.

4. The calibration system of claim 2, wherein the coils are equal in size and shape.

5. The calibration system of claim 4, wherein the coils are larger in size than the vehicle.

6. The calibration system of claim 2, wherein a subset of coils of the plurality of coils is bifurcated for decoupling the coils.

7. The calibration system of claim 6, wherein each coil in the subset of coils includes one or more junctions for coupling the coils, each junction including complementary connectors on either side of the coil that is bifurcated.

8. The calibration system of claim 1, wherein the vehicle platform includes a vehicle stand with an indentation complementary in shape to a shape of the vehicle.

9. The calibration system of claim 8, wherein the vehicle stand is movable along the vehicle platform from a loading position where the vehicle stand is external to the magnetic field generator to a testing position where the vehicle stand is internal to the magnetic field generator.

10. The calibration system of claim 1, wherein the vehicle includes a payload formed at least in part on a material that interferes with the referential magnetic field.

11. A method comprising:
   loading a vehicle onto a vehicle platform in a testing position where the vehicle is internal to a magnetic field generator;
   generating a plurality of referential magnetic fields using the magnetic field generator;
   receiving magnetometer measurements from a magnetometer implemented on board the vehicle;
   determining calibration parameters for the magnetometer based on the magnetometer measurements and the plurality of referential magnetic fields; and
   calibrating the magnetometer with the calibration parameters.

12. The method of claim 11, wherein the vehicle comprises a payload formed at least in part on a material that interferes with the referential magnetic field.

13. The method of claim 11, wherein loading the vehicle onto the vehicle platform comprises:
   loading the vehicle onto a vehicle stand at a loading position relative to the vehicle platform, the vehicle stand comprising an indentation having a complementary shape to a shape of the vehicle; and
   translocating the vehicle on the vehicle stand from the loading position to a testing position where the vehicle and the vehicle stand are internal to the magnetic field generator.

14. The method of claim 11, wherein generating the plurality of referential magnetic fields comprises:
   generating referential magnetic fields in three orthogonal axes.

15. The method of claim 11, wherein generating the plurality of referential magnetic fields comprises:
   generating referential magnetic fields of varying strength.

16. The method of claim 11, wherein determining the calibration parameters for the magnetometer based on the magnetometer measurements and the plurality of referential magnetic fields comprises:
   aligning the magnetometer measurements to the plurality of referential magnetic fields;
   determining an error for each of the magnetometer measurements against the corresponding referential magnetic field; and
   determining the calibration parameters that correct the errors.

17. The method of claim 16, wherein determining the calibration parameters for the magnetometer further comprises:
   determining a correction matrix to account for soft iron distortion transforming a distribution into a spherical distribution; and
   determining an offset matrix to account for hard iron distortion shifting a center point of the spherical distribution.

18. The method of claim 11, wherein determining the calibration parameters for the magnetometer based on the magnetometer measurements and the plurality of referential magnetic fields comprises:
   determining a first set of calibration parameters for a first configuration of the vehicle with a payload; and
   determining a second set of calibration parameters for a second configuration of the vehicle without the payload.

19. The method of claim 18, wherein calibrating the magnetometer with the calibration parameters comprises:

configuring the magnetometer with the first set of calibration parameters when the vehicle is in the first configuration; and configuring the magnetometer with the second set of calibration parameters when the vehicle is in the second configuration.

20. A non-transitory computer-readable storage medium storing instructions that, when executed by a computer processor, cause the computer processor to perform operations comprising:

loading a vehicle onto a vehicle platform in a testing position where the vehicle is internal to a magnetic field generator;

generating a plurality of referential magnetic fields using the magnetic field generator;

receiving magnetometer measurements from a magnetometer implemented on board the vehicle;

determining calibration parameters for the magnetometer based on the magnetometer measurements and the plurality of referential magnetic fields; and calibrating the magnetometer with the calibration parameters.

* * * * *